(12) United States Patent
Hung et al.

(10) Patent No.: US 8,574,978 B1
(45) Date of Patent: Nov. 5, 2013

(54) METHOD FOR FORMING SEMICONDUCTOR DEVICE

(75) Inventors: Ching-Wen Hung, Tainan (TW);
Chih-Sen Huang, Tainan (TW);
Ling-Chun Chou, Yun-Lin County (TW); I-Chang Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/443,894

(22) Filed: Apr. 11, 2012

(51) Int. Cl.
*H01L 21/8238* (2006.01)
*H01L 21/336* (2006.01)

(52) U.S. Cl.
USPC ........... 438/230; 438/300; 438/303; 438/595; 257/E21.293

(58) Field of Classification Search
USPC ......... 438/199, 222, 230, 304, 595, 300, 303; 257/E21.293, E21.431, E21.437
See application file for complete search history.

(56) References Cited

U.S. PATENT DOCUMENTS

| | | | | |
|---|---|---|---|---|
| 6,512,273 | B1 * | 1/2003 | Krivokapic et al. | 257/369 |
| 7,064,085 | B2 * | 6/2006 | Chiu et al. | 438/775 |
| 7,816,273 | B2 | 10/2010 | Krueger | |
| 7,875,514 | B2 * | 1/2011 | Richter et al. | 438/218 |
| 7,932,144 | B2 * | 4/2011 | Liu et al. | 438/232 |
| 8,043,921 | B2 * | 10/2011 | Kirkpatrick et al. | 438/303 |
| 2003/0032300 | A1 * | 2/2003 | Waldfried et al. | 438/725 |
| 2010/0159680 | A1 * | 6/2010 | Jung | 438/514 |
| 2010/0210084 | A1 * | 8/2010 | Yang et al. | 438/285 |
| 2011/0104900 | A1 * | 5/2011 | Hinsberg et al. | 438/694 |

* cited by examiner

*Primary Examiner* — Tuan N. Quach
(74) *Attorney, Agent, or Firm* — Winston Hsu; Scott Margo (57) ABSTRACT

A method for forming a semiconductor device includes firstly providing a gate structure disposed on a substrate and a first nitride material layer disposed on the gate structure, secondly performing a protective step to modify the first nitride material layer in the presence of oxygen, then forming a second nitride material layer on the substrate, and later performing a removal step to remove the second nitride material layer without substantially slashing the modified first nitride material layer.

19 Claims, 13 Drawing Sheets

METHOD FOR FORMING SEMICONDUCTOR DEVICE

BACKGROUND OF THE INVENTION

1. Field of the Invention

The present invention generally relates to a method for forming a semiconductor device. In particular, the present invention is directed to firstly carrying out a protective step to modify a first nitride material layer in the presence of oxygen, then carrying out a removal step to remove a second nitride material layer without substantially damaging the modified first nitride material layer. In such a way, the first nitride material layer may be free from slashing when the second nitride material layer is removed.

2. Description of the Prior Art

In the conventional semiconductor processes, it is proposed to increase the performance of a semiconductor element. Some general approaches are introduction of stress-boosting schemes to enhance the carrier mobility, new gate dielectric materials and/or new gate electrode materials.

However, those approaches all have drawbacks and may cause many collateral issues, such as they may make the manufacturing process more difficult and creates a lot of integration problems.

As a result, a novel semiconductor process is still needed to overcome the problems.

SUMMARY OF THE INVENTION

Given the above, the present invention therefore proposes a novel semiconductor process to firstly remove a photoresist in the absence of oxygen, and then carry out a protective step in the presence of oxygen. To remove a photoresist in the absence of oxygen, no material would be collaterally oxidized but a protective step in the presence of oxygen may modify a first nitride material layer so that the removal of another nitride material layer does not substantially damage the modified first nitride material layer. In such a way, the first nitride material layer is free from being slashed during the removal step so the novel semiconductor process of the present invention benefits from both advantages of the oxygen-rich and of the oxygen-free approaches.

The present invention in a first aspect proposes a method for forming a semiconductor device. First, a substrate is provided. There are a gate structure disposed on the substrate and a spacer surrounding the gate structure. Second, an implantation step is carried out to form a lightly doped drain (LDD) in the substrate on at least one side of the gate structure which is without the protection of a photoresist. Then, a stripping step is carried out to remove the photoresist in the absence of oxygen. Later, a protective step is carried out to modify the spacer in the presence of oxygen to obtain a resultant modified spacer. In such a way, a removal step is carried out after the protective step to remove another material layer consisting of nitride. The previous protective step keeps the modified first nitride material layer from being substantially damaged during the later removal step.

In one embodiment of the present invention, at least the surface of the spacer consists of silicon nitride.

In another embodiment of the present invention, the spacer is oxidized in the protective step so that the surface of the spacer consists of both silicon nitride and an oxide after the protective step.

In another embodiment of the present invention, an oxygen-free gas is used to form a condition in the absence of oxygen, and the stripping step further uses an alkaline substance to clean the substrate, the gate structure and the spacer.

In another embodiment of the present invention, the material layer is a disposable spacer in a selective epitaxial growth (SEG) process.

In another embodiment of the present invention, the material layer is a strained layer to provide a stress in a stress-memorizing technique (SMT).

In another embodiment of the present invention, the material layer is a patterned hard mask to define the gate structure.

In another embodiment of the present invention, the modified spacer has a dimensional loss less than 5 Å after the removal step.

In another embodiment of the present invention, the protective step includes at least one of a dry oxidization and a wet oxidization.

In another embodiment of the present invention, the protective step further includes cleaning the substrate, the gate structure and the spacer with de-ionized water.

The present invention in a second aspect proposes another method for forming a semiconductor device. First, a substrate without a photoresist is provided. A gate structure is disposed on the substrate and a first material layer is disposed on the gate structure. The first material layer includes a nitride. Second, a protective step is carried out to modify the first material layer in the presence of oxygen. Then, a second nitride material layer is formed on the substrate after the protective step, and later a removal step is carried out after the protective step to remove a second material layer with a non-oxidative acid. The second material layer includes a nitride, too. In such a way, the protective step is able to substantially keep the first material layer from the influence of the removal step.

In one embodiment of the present invention, the first material layer is oxidized in the protective step so that the surface of the first material layer consists of both silicon nitride and an oxide.

In another embodiment of the present invention, the protective step further includes cleaning the substrate, the gate structure and the first material with de-ionized water.

In another embodiment of the present invention, the protective step uses at least one of gaseous oxygen, plasma oxygen and a wet chemical treatment.

In another embodiment of the present invention, the gate structure further includes a nitride hard mask. An annealing step is carried out before the removal of the second material layer to alter a stress in the substrate by means of the second material layer.

In another embodiment of the present invention, the second material layer becomes a sacrificial spacer disposed on the first material layer for use in the selective epitaxial growth (SEG) process so the sacrificial spacer may be removed by a non-oxidative acid in the removal step.

In another embodiment of the present invention, the second material layer is a sacrificial spacer surrounding the first material layer. The first material layer and the nitride hard mask for defining the gate structure are simultaneously modified, and the second material layer is formed after the protective step. A de-modification step is exclusively carried out on the hard mask in the presence of the sacrificial spacer so the second material layer as well as the hard mask are removed at the same time in the removal step without substantially influencing the modified the first material layer.

In another embodiment of the present invention, the second material layer is formed between the protective step and the removal step.

In another embodiment of the present invention, the first material layer has a dimensional loss less than 5 Å after the removal step.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 and 12 to 17 illustrate another example of the process to form the semiconductor device of the present invention in the absence of a photoresist.

DETAILED DESCRIPTION

Figure 1:
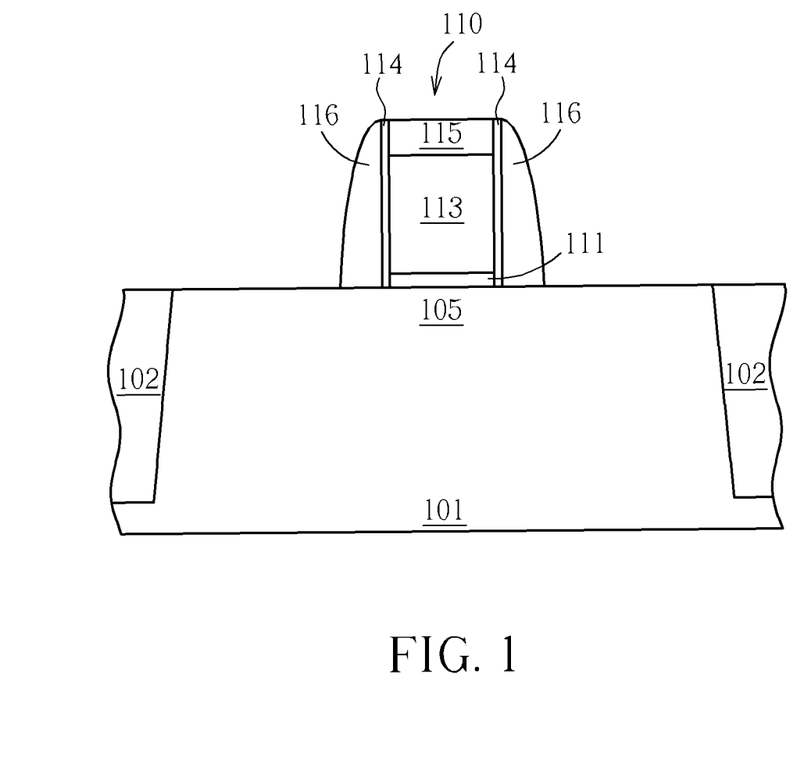
FIGS. 1 to 11 illustrate one example of a process to form the semiconductor device of the present invention in the presence of a photoresist.

FIGS. 1 to 11 illustrate a first example of a process to form the semiconductor device of the present invention. In this example there may be a photoresist disposed on the substrate. First, as shown in FIG. 1, a substrate 101 is provided. The substrate 101 may be a semiconductive material, such as a silicon substrate, an epitaxial silicon substrate, a silicon germanium substrate, a silicon carbide substrate or a silicon-on-insulator (SOI) but is not limited to those. In addition, there may be several shallow trench isolations 102 for use as an electric segregation in the substrate 101. The following steps may be a possible way to form the needed shallow trench isolations 102. First, a hard mask (not shown) is used to etch the substrate 101 to form several trenches (not shown) for the shallow trench isolations 102. Later, an isolation material (not shown) is used to fill the previously formed trenches (not shown) to obtain the needed shallow trench isolations 102 after a planarization is carried out to remove the excess isolation material (not shown). At last, the hard mask (not shown) is removed.

Further, a gate structure 110 may be formed on the substrate 101. The gate structure 110 may include a gate dielectric layer 111, an optional high-k dielectric layer (not shown), an optional barrier layer (not shown), a gate material layer 113 and a hard mask 115 atop covering the gate material layer 113. The gate structure 110 further has a pad layer 114, for example a silicon oxide layer formed by thermal oxidation, surrounding the gate material layer 113 as well as a spacer 116 surrounding the pad layer 114. The hard mask 115 and spacer 116 may respectively have a material of silicon nitride. The gate dielectric layer 111 is in direct contact with the substrate 101 for use as the electric isolation between the gate structure 110 and the substrate 101. If the gate structure 110 is a Si gate, the gate material layer 113 may include a doped poly Si and the gate dielectric layer 111 may include a Si-containing compound, such as silicon oxide, silicon nitride, silicon oxynitride or the combination thereof. Alternatively, the gate structure 110 may also be a metal gate (not shown), so the gate material layer 113 includes a metal material. Or, the metal gate (not shown) is constructed by replacing a dummy gate with a metal material in a later process. The dummy gate may be formed with a sacrificial material such as undoped poly Si.

If the gate structure 110 is a metal gate (not shown), the gate dielectric layer 111 may include an oxide, such as silicon oxide. The high-k dielectric layer may include a high-k material, for example a rare earth metal or a lanthanide metal oxide, with a dielectric constant (k) approximately larger than 4, for example hafnium oxide ($HfO_2$), hafnium silicon oxide, ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide, ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), or barium strontium titanate ($Ba_xSr_{1-x}TiO_3$, BST). The barrier layer (not shown) serves to segregate the gate material layer 113 and the bottom and possibly includes a metal compound, such as titanium nitride or tantalum nitride.

The procedures to form the spacer 116 may be as follows. First, a material layer (not shown) is blanketly formed to cover the substrate 101, the shallow trench isolations 102 and the gate structure 110 which are formed in advance. The material layer (not shown) itself may be a single layer or a composite layer formed by depositing different material layers. Next, the material layer is etched to become the spacer 116. Regardless the material layer (not shown) itself is a single layer or a composite layer, in this example the surface of the spacer 116 basically consists of silicon nitride.

Then, a lightly doped drain (LDD) implanting step is carried out on the substrate 101. If both a PMOS region 103 and an NMOS region 104 are present on the substrate 101, one of the PMOS region 103 and the NMOS region 104 may be shielded by a suitable patterned photoresist in advance to carry out a suitable lightly doped drain (LDD) implanting step on the other, to respectively obtain a lightly doped drain region 120/220 for respective use in the PMOS region 103 and the NMOS region 104. The details for forming the patterned photoresist are well known in the art and will not be elaborated here.

Figure 2:
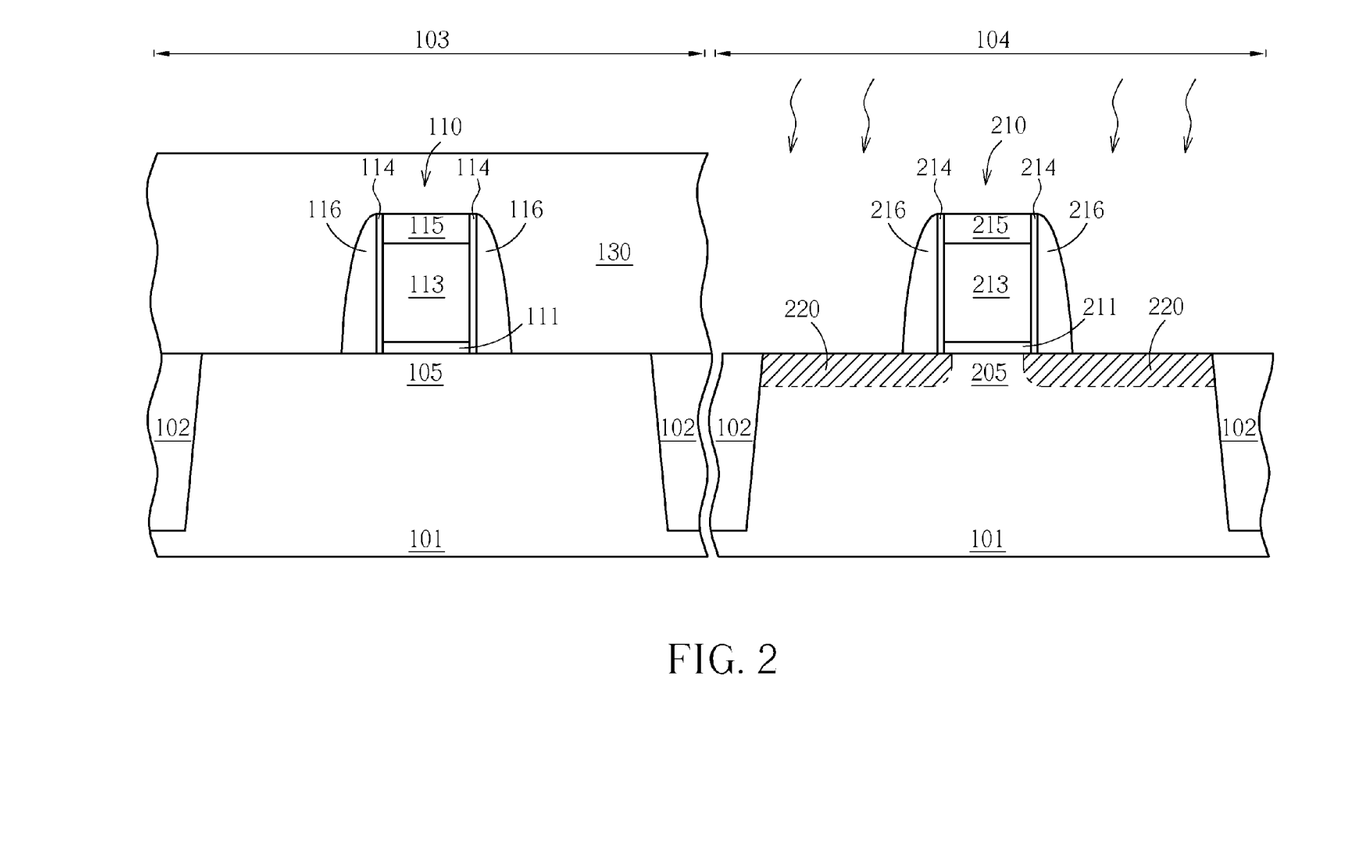

The corresponding patterned photoresist is stripped after each suitable lightly doped drain (LDD) implanting step is completed. For example, as shown in FIG. 2, a suitable lightly doped drain (LDD) implanting step is performed on the NMOS region 104 in the presence of the shielding of the patterned photoresist 130 in the PMOS region 103 to implant suitable dopant in the exposed substrate 101 to obtain a lightly doped drain 220 disposed in the substrate 101 adjacent to at least one side of the gate structure 210 in the NMOS region 104. Between the lightly doped drains 220 lies the gate channel 205.

Figure 3:
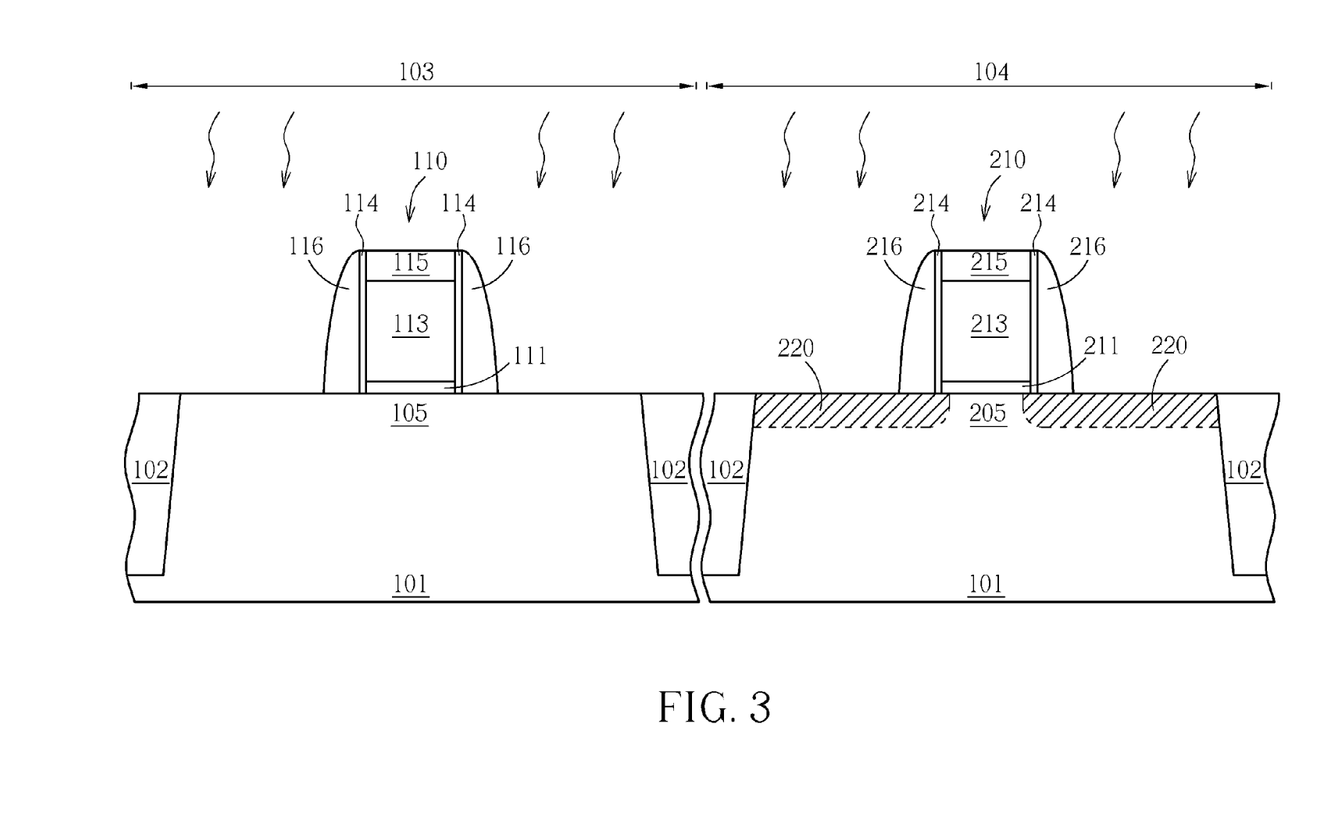

After the lightly doped drains 220 in the NMOS region 104 are completed, the patterned photoresist 130 in the PMOS region 103 needs stripping, as shown in FIG. 3. In this example the process to strip the patterned photoresist 130 is preferably carried out in the absence of oxygen, for example to use an oxygen-free gas, to be a low loss clean (LLC). An oxygen-free condition does not jeopardize the substrate 101 and the lightly doped drains 220 in the substrate 101. For example, a mixture of nitrogen/hydrogen containing 8% hydrogen may be used to strip the patterned photoresist 130 with the assistance of plasma. The process to strip the patterned photoresist (PR) 130 may include multiple stages. For example, multiple stages such as pre-heating, crust removal, PR strip and PR over ashing, may be carried out in the temperature range from 240° C. to 350° C. Each stage may take 18 seconds to 36 seconds. In the pre-heating stage, the nitrogen/hydrogen gas mixture may be absent.

Figure 4:
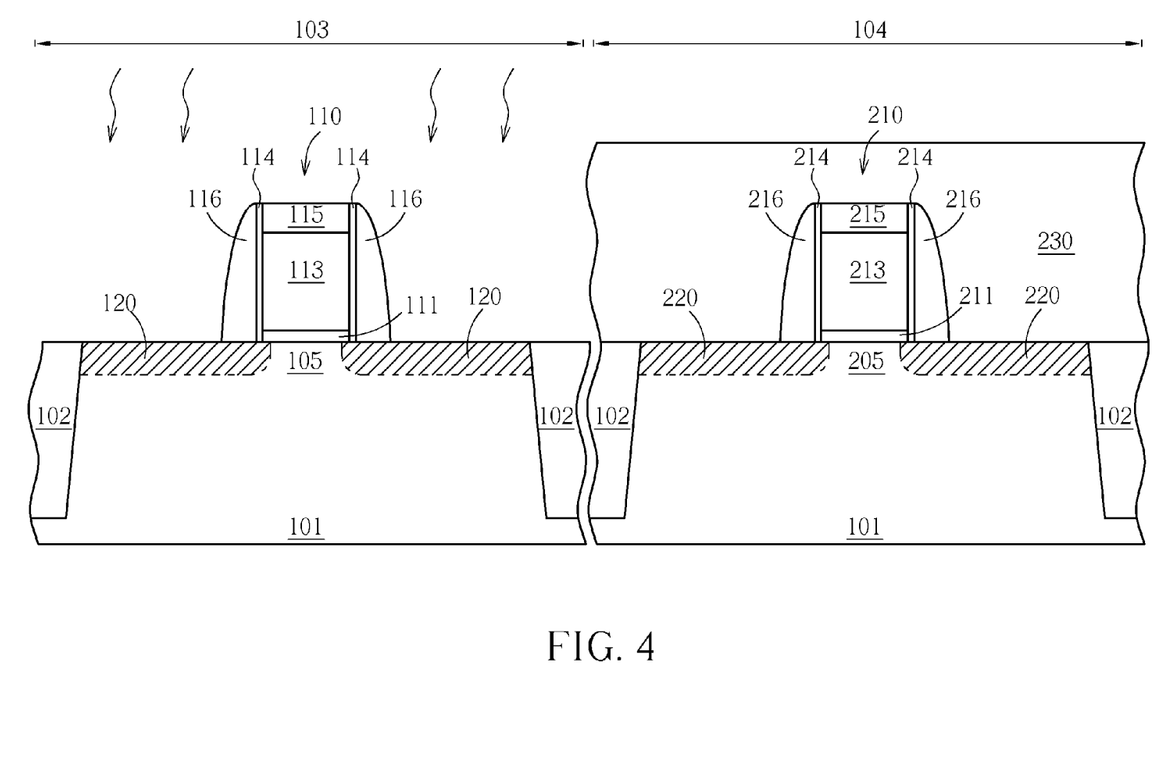
Figure 5:
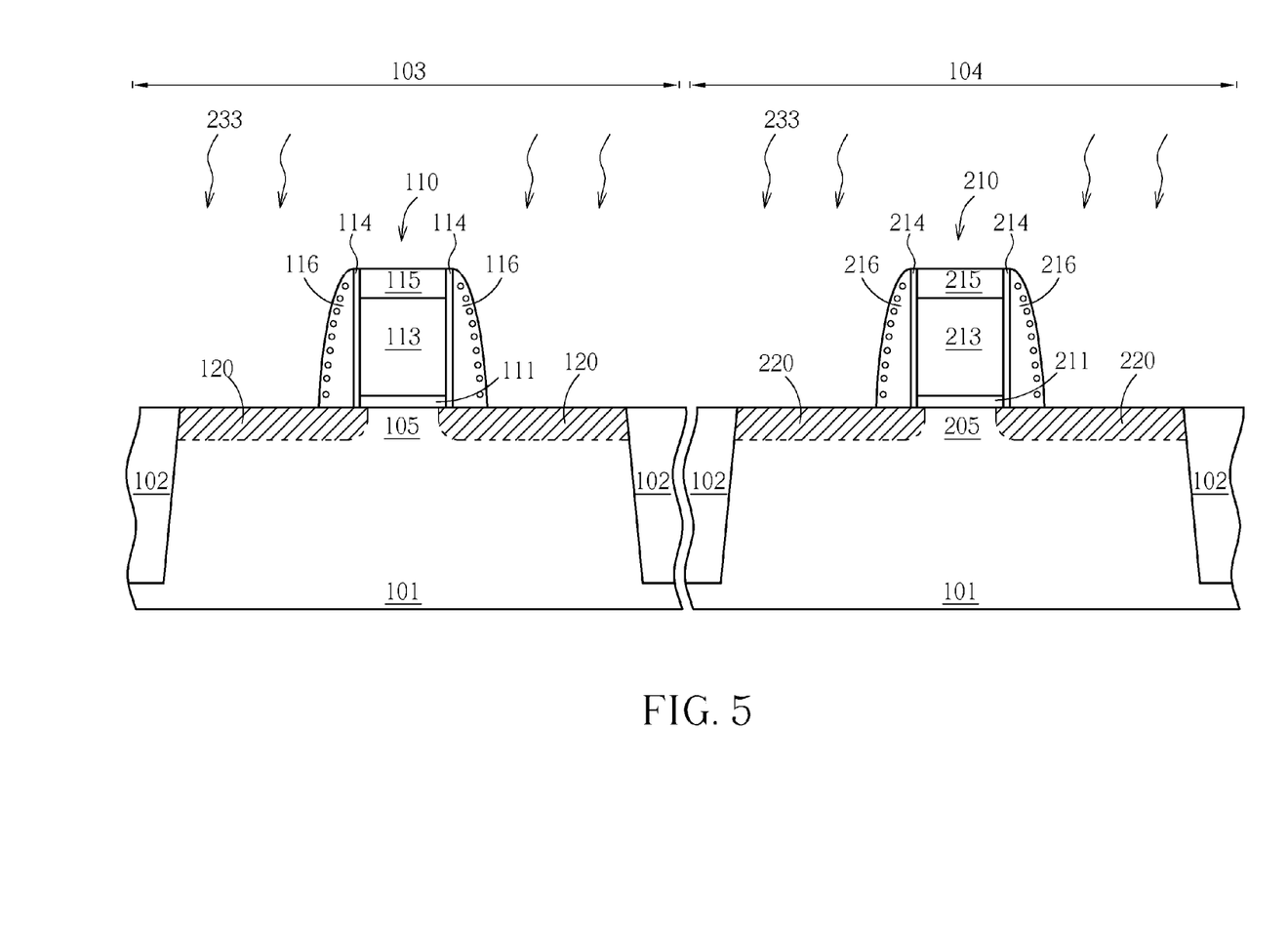

Then as shown in FIG. 4, after the previous lightly doped drain implanting step, another suitable lightly doped drain implanting step is performed on the PMOS region 103 in the presence of the shielding of the patterned photoresist 230 in the NMOS region 104 to implant suitable dopant in the exposed substrate 101 to obtain a lightly doped drain 120 disposed in the substrate 101 adjacent to at least one side of the gate structure 110 in the PMOS region 103. After the lightly doped drains 120 are completed, the patterned photoresist 230 needs stripping, as shown in FIG. 5. In this example the process to strip the patterned photoresist 230 is also preferably in the absence of oxygen, for example to use an oxygen-free gas, to be a low loss clean (LLC). An oxygen-free condition does not jeopardize the substrate 101 and the existing lightly doped drains 120/220 in the substrate 101 to reduce the material loss as much as possible. Please refer to the above-mentioned descriptions for the details of the removal of the patterned photoresist 230.

Optionally, in the process to remove the patterned photoresist 230 and/or the patterned photoresist 130, an alkaline substance may be used to clean the substrate 101, the gate structure 110/210 and the spacer 116/216. Such alkaline substance may be an alkaline mixture, for example an ammonia/hydrogen peroxide mixture standard clean (SC1) solution. This kind of wet cleaning may remove residue polymers and to reduce possible material loss.

Please note that after stripping the patterned photoresist for use in the lightly doped drain implanting step, a protective step 233 is carried out in the present invention to modify the spacer 116/216 whose surface consists of nitride, as shown in FIG. 5. For example, the spacer 116/216 whose surface consists of nitride is modified in the presence of oxygen and in the absence of a photoresist to obtain a modified spacer 116/216 whose surface includes both nitride and an oxide (indicated by hollow dots). An oxygen-rich environment may be a dry oxidation such as gaseous oxygen, plasma oxygen and/or a wet oxidation such as a wet chemical treatment to provide a chemical oxidizing environment. In one preferred example of the present invention, an conventional $O_2$ strip process may serve as the protective step at this moment even when the photoresist is absent from the substrate 101 to modify the surface of the spacer 116/216. Optionally, the protective step may also use de-ionized water to clean the substrate 101, the gate structure 110/210 and the modified spacer 116/216.

After or before the formation of the spacer 116/216 whose surface consists of nitride is finished, another temporary material layer including nitride may also be formed on the substrate 101 during the semiconductor processes. This temporary material layer is removed when the service is no longer required. In order to avoid the damages to the spacer 116/216 caused by the removal of the temporary material layer, the present invention modifies the surface of the spacer 116/216 which consists of nitride in the protective step. In addition, the protective step of the present invention to modify the spacer 116/216 whose surface consists of nitride may be carried when the spacer 116/216 is formed. Accordingly, in a later step to remove the temporary material layer the thickness of the modified spacer 116/216 will not substantially change. For example, if the thickness of the modified spacer 116/216 is around 50 Å before the removal of the temporary material, the thickness of the modified spacer 116/216 is not less than 45 Å after the removal of the temporary material. In other words, the dimensional loss of the modified spacer 116/216 is not greater than 5 Å after the removal step. There are some embodiments to illustrate the use of the temporary material as follows.

First Embodiment

The temporary material may be a disposable spacer in a selective epitaxial growth (SEG) process. The selective epitaxial growth process may introduce a stress into a gate channel, which is a technical means to improve the carrier mobility of the MOS properties. For example, after a disposable spacer is formed, a SiGe layer is selectively epitaxially grown in the recess in the semiconductive substrate adjacent to the disposable spacer to form a compressive strained channel to improve the electron hole mobility, or alternatively to form a SiC layer to form a tensile strained channel to improve the electron mobility.

Figure 6:
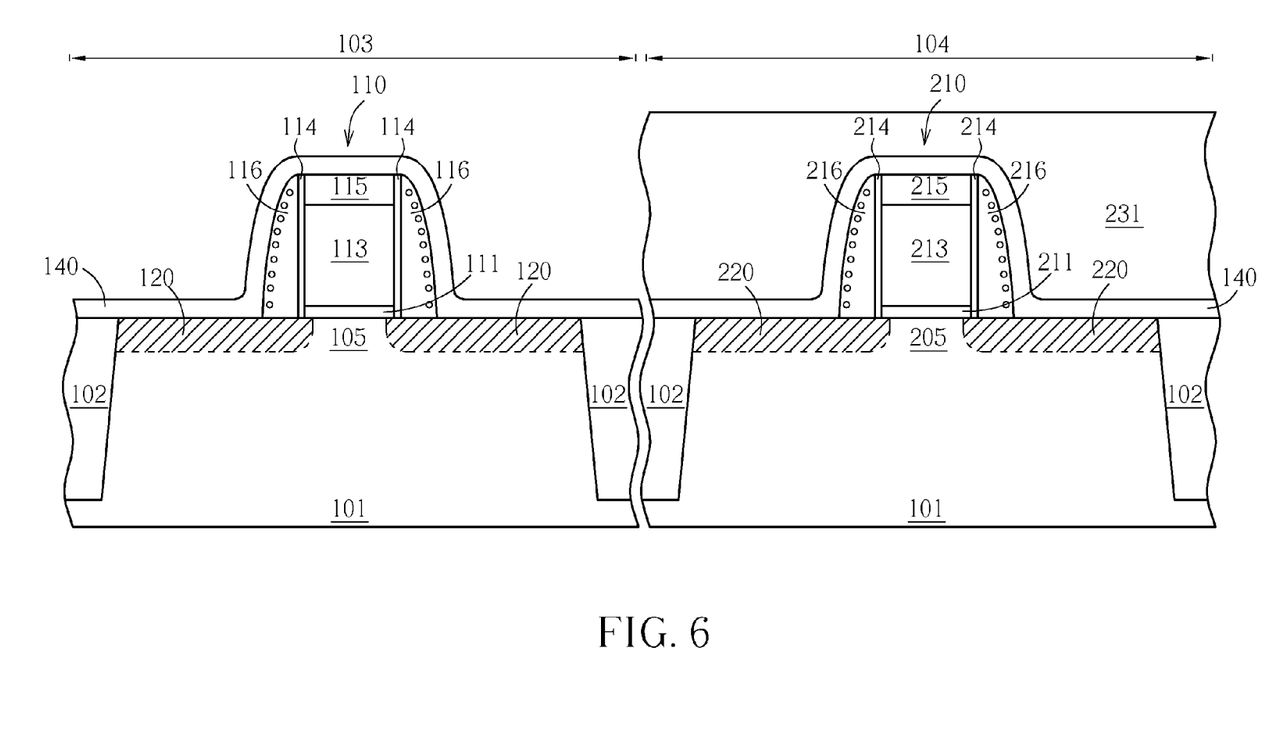
Figure 7:
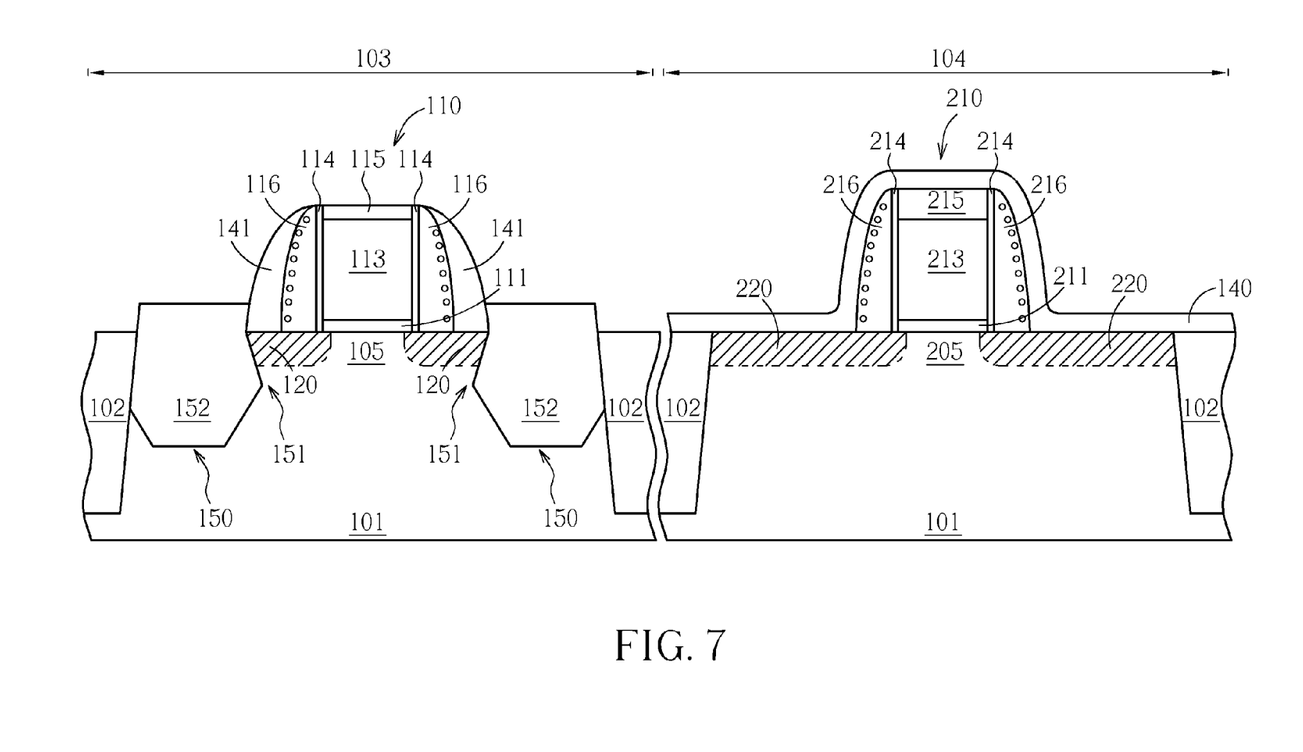
Figure 8:
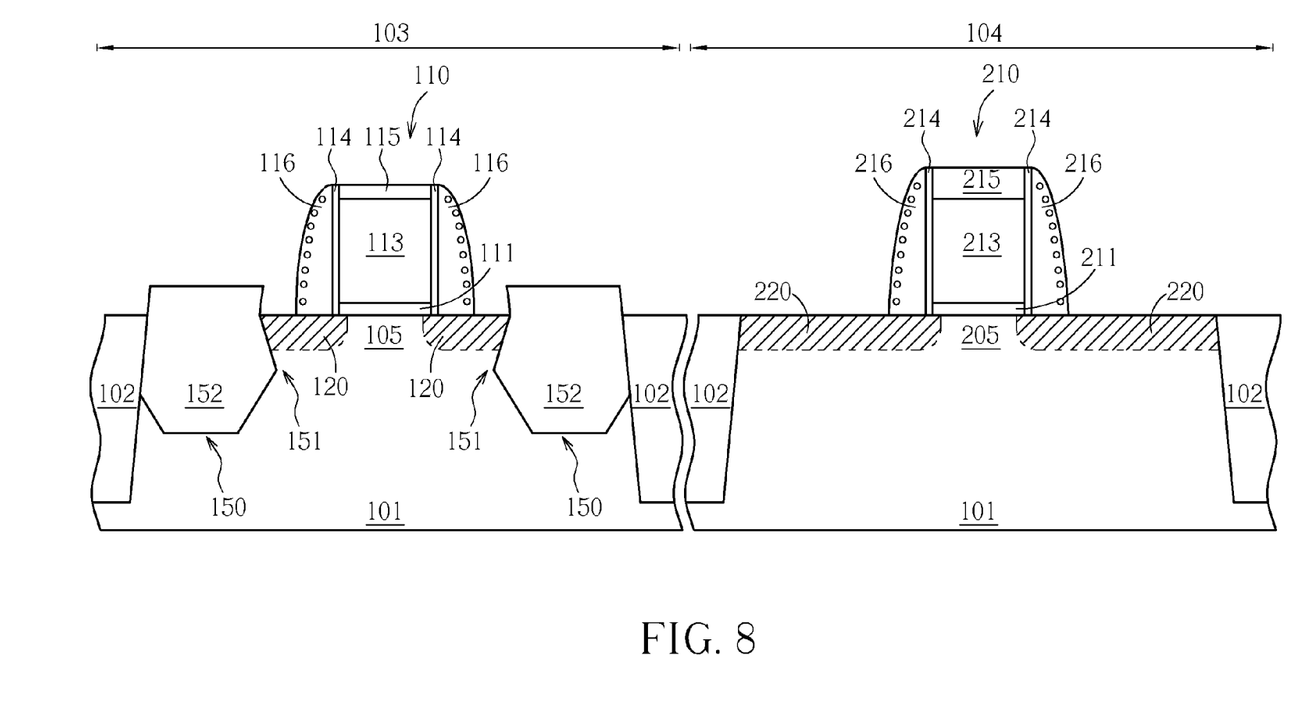

FIGS. 6-8 illustrate the temporary material of the present invention for use as a disposable spacer in a selective epitaxial growth process. First, as shown in FIG. 6, a material 140 is used to blanketly cover the substrate 101, the gate structure 11/210 and the modified spacer 116/216. The material 140 may include a silicon-containing compound, such as silicon nitride. Specifically speaking, the silicon nitride layer may be formed by a Si-containing precursor, such as by hexachlorosilane (HCD) or a precursor of hexachlorosilane deposited by an atomic layer deposition process (ALD-HCD) but the present invention is not limited to these.

Second, please refer to FIGS. 6/7, the NMOS region 104 is shielded by the patterned photoresist 231 to carry out a dry etching step and the material layer 140 in the PMOS region 103 is patterned to simultaneously turn this material layer 140 in the PMOS region 103 into a disposable spacer 141 which surrounds the gate structure 110 and the spacer 116 after lithographic and etching procedures. The disposable spacer 141 for the moment temporarily becomes part of the gate structure 110. The etching step may consume some of the pad layer 114, the hard mask 115 and the spacer 116.

Preferably, these etching procedures may also be used to remove part of the substrate 101 in the PMOS region 103 to obtain at least one recess 150. Or, independent etching procedures may also be used to remove part of the substrate 101 to obtain at least one recess 120 after the disposable spacer 141 is formed.

The etching procedures of the recess may be a dry etching in combination with a wet etching and the recess 150 may have special 3-dimensional shapes in accordance with different etching recipes. For example, a dry etching is first carried out and followed by a wet etching to laterally extend the recess 150 toward the gate channel 105. Simultaneously, part of the recess 150 below the gate structure 110 may be in a shape of a wedge so that the recess 150 may further include a tip 151 disposed below the gate structure 110.

Next, please refer to FIG. 7, after a cleaning procedure done to the recess, a doped epitaxial material 152 is used to fill up the recess 150 by an epitaxial step. Optionally, before the growth of the epitaxial material 152, a hydrogen pre-baking step may be introduced, or the growth of the doped epitaxial material 152 and the hydrogen pre-baking step may be carried out together in-situ. The doped epitaxial material 152 usually includes at least two different tetravalent materials and a suitable dopant. The two different tetravalent materials may be Si and Ge. The dopant may be B. Further, the doped epitaxial material 152 may have several parts. For example, a buffer layer (not shown) which is disposed at the bottom of the recess 150 may include Ge of low concentration, and may have no boron or a little of B, to reduce the dissimilarity of different lattices with respect to the substrate 101. The bulk layer (not shown) which is disposed in the middle of the recess 150 may include Ge of high concentration and a lot of B, to mainly serve as the stress source of the gate channel 105. The cap layer (not shown) on the bulk layer may preferably contain nothing but pure epitaxial Si. Next, after the selective epitaxial growth process is completed the disposable spacer 141 is removed, as shown in FIG. 8.

One possible approach to remove the disposable spacer 141 may use an oxygen-containing non-oxidative acid, such as hot phosphoric acid. Hot phosphoric acid strips the disposable spacer 141 formed of nitride as well as the material layer 140 covering the NMOS region 104. Because the spacers 116/216 whose surface also consists of nitride have already been modified, the thickness of the spacers 116/216 rarely changes in a later step to remove the disposable spacer 141. In such a way, the electronic properties of the gate structure 110 are able to remain intact.

Second Embodiment

The temporary material may also be a stress-providing layer in a stress memorization technique (SMT). Generally speaking, another approach to introduce a stress into a MOS transistor is called a stress memorization technique (SMT). The stress memorization technique (SMT) generally includes the following steps: 1) performing a pre-amorphization implant (PAI) step to form an amorphous region in the substrate; 2) selectively depositing a strained layer on the substrate; 3) performing a thermal activation so that the substrate is able to memorize the stress from the strained layer; and 4) removing the strained layer.

Figure 9:
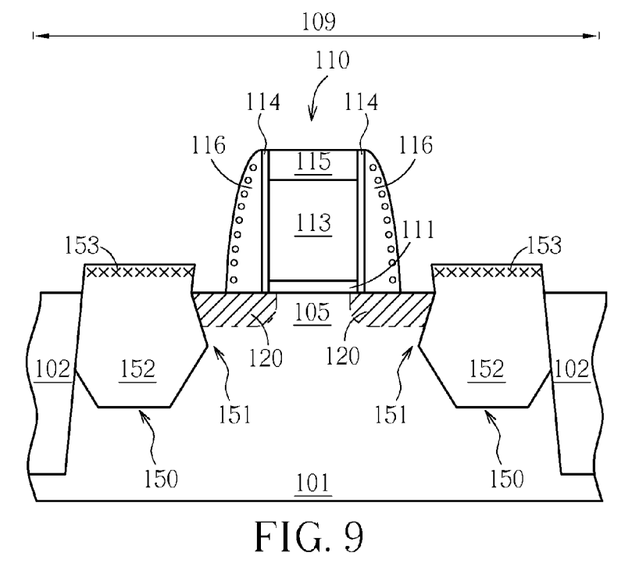
Figure 10:
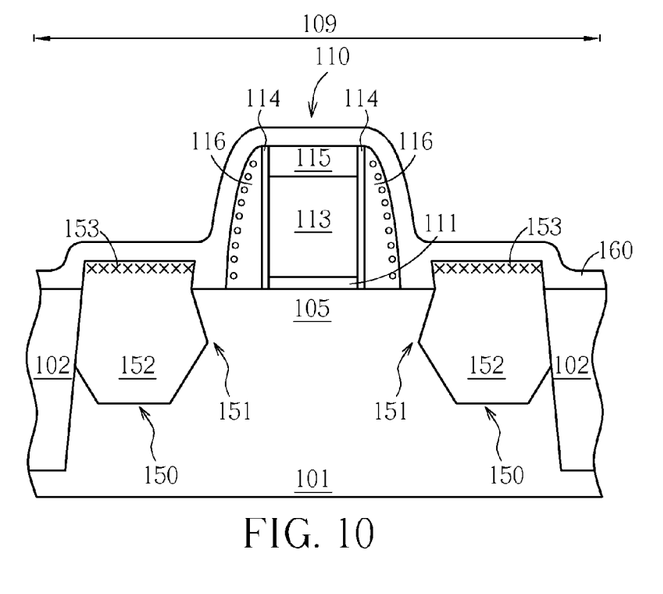
Figure 11:
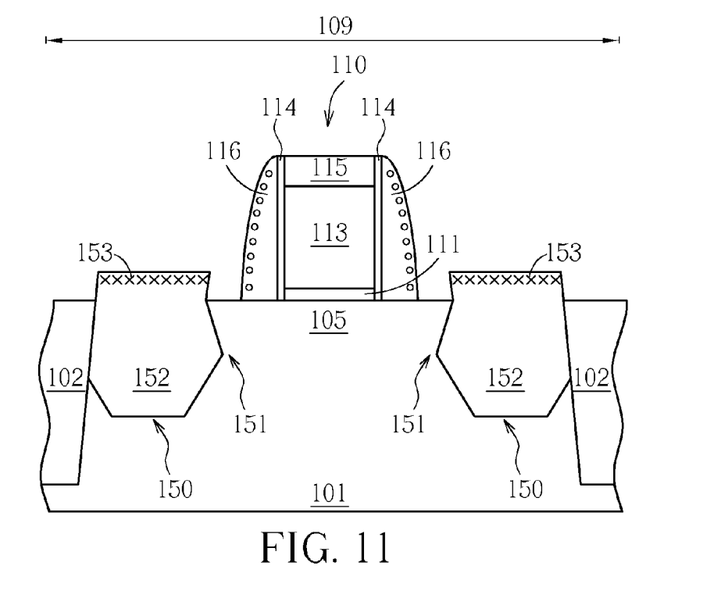

FIGS. 9-11 illustrate the temporary material of the present invention for use as a stress-providing layer, namely a strained layer, in a stress memorization technique. First, as shown in FIG. 9, a pre-amorphization implant (PAI) procedure is carried out to form an amorphous region 153. If the doped epitaxial material 152 is absent, the pre-amorphization implant (PAI) procedure may be carried out on the region 109 of the substrate 101 to form an amorphous region. Alternatively, if the doped epitaxial material 152 is present, the pre-amorphization implant (PAI) procedure may be carried out on the doped epitaxial material 152 to form an amorphous region 153. FIG. 9 illustrates the pre-amorphization implant (PAI) procedure is carried out on the doped epitaxial material 152 to form the amorphous region 153 in the region 109. The pre-amorphization implant (PAI) procedure may be a right angle or an angled PAI procedure to form the amorphous region 153 on at least one side disposed adjacent to the gate structure 110 by ion implantation with dopant such as In, Sb or Ge of a suitable energy or dosage to break the lattice structure of the substrate 101 or the doped epitaxial material 152. In accordance with one embodiment of the present invention, the pre-amorphization implant (PAI) procedure may be carried out before the implantation step of the source/drain (not shown).

Later, the stress memorization technique of the present invention will introduce the stress into the gate channel 105 through the doped epitaxial material 152 to adjust, for example to increase the carrier mobility in the gate channel 105. The following steps for the stress memory technique (SMT) may be as follows. First, a strained layer 160 is formed, for example by plasma enhanced CVD, to blanketly cover the doped epitaxial material 152, the amorphous region 153, the spacer 116 and the gate structure 110, as shown in FIG. 10. The strained layer 160 may consist of silicon nitride with a suitable and sufficient stress. In accordance with one preferred embodiment of the present invention, the strained layer 160 has a specific stress, such as one of a compressive stress or a tensile stress. For example, as far as an NMOS transistor is concerned, the strained layer 160 has a tensile stress. Alternatively, as far as a PMOS transistor is concerned, the strained layer 160 has a compressive stress. Afterward, in another embodiment a surface treatment, such as a UV curing process, a thermal spike anneal process or an e-beam treatment, can be carried out to the transitional strained layer 160 so as to alter the stress value.

Subsequently, an annealing step is carried out. For example, the laser annealing step may be laser spike annealing (LSA) or a laser thermal annealing (LTA), but not limited thereto, to form a stress-memorizing layer, which possibly includes both the gate channel 105 and the doped epitaxial material 152, adjacent to the amorphous region 153. Please note that the stress memory annealing procedure transfers the stress from the strained layer 160 to both the gate channel 105 and the doped epitaxial material 152. After the stress is transferred from the strained layer 160 to both the gate channel 105 and the doped epitaxial material 152 in the annealing procedure, the strained layer 160 may be removed, as shown in FIG. 11. After the laser annealing process is completed, a rapid thermal process (RTP) under a different temperature may be optionally carried out. The rapid thermal process may be a spike RTP, for example. According to the one embodiment of this invention, the strained layer 160 may have been removed before the rapid thermal process (RTP) is carried out.

One possible approach to remove the strained layer 160 may use an oxygen-containing non-oxidative acid, such as hot phosphoric acid. Hot phosphoric acid strips the strained layer 160 formed of nitride. Because the spacers 116/216 whose surface also consists of nitride have already been modified, the thickness of the spacers 116/216 rarely alters in a later step to remove the strained layer 160. In such a way, the electronic properties of the gate structure 110 can remain intact.

In addition, after the above first embodiment or the above second embodiment, other necessary semiconductor steps may be carried out too, such as the source/drain implantation step to form the source/drain region (not shown), to replace the gate material layer 113 with an apt metal material to obtain a metal gate, the formation of silicide, the formation of contact etching-stop layer (CESL), the formation of contact holes, or the formation of contact plugs . . . etc. Please note that the selective epitaxial growth process, the stress memorization technique or other possible semiconductor procedures may be carried out alone or together so it is possible to combine one step of a process with one step of another process albeit the above first embodiment and the above second embodiment merely respectively describe a SEG and a SMT. The contact plugs (not shown) for a source (not shown) and a drain (not shown) may have asymmetric shapes, such as in a rectangular shape for one and in a shape of an extending strip for the other. These necessary steps are well known to persons in the art and the details will not be elaborated here.

Third Embodiment

FIGS. 1 and 12 to 17 illustrate another example of the process to form the semiconductor device of the present invention. In this example there is no photoresist disposed on the substrate. First, as shown in FIG. 1, a substrate 101 with no photoresist is provided. There may be a shallow trench isolation 102 disposed in the substrate 101, and a first material layer 116 or other optional elements disposed on the gate structure 110 in one of a PMOS region and an NMOS region but there is no photoresist. The region 109 may be one of a PMOS region or an NMOS region.

Please refer to the above descriptions for the details of the gate structure 110, which generally includes a gate dielectric layer 111, an optional high-k dielectric layer (not shown), an optional barrier layer (not shown), a gate material layer 113, a hard mask 115 and the first material layer 116. For example, the temporary layer may be a hard mask 115 for defining the gate structure 110. The first material layer 116 and the hard mask 115 may respectively include a nitride, such as silicon nitride, and the first material layer 116 may be preferably for use as a spacer of the gate structure 110 for example.

Figure 12:
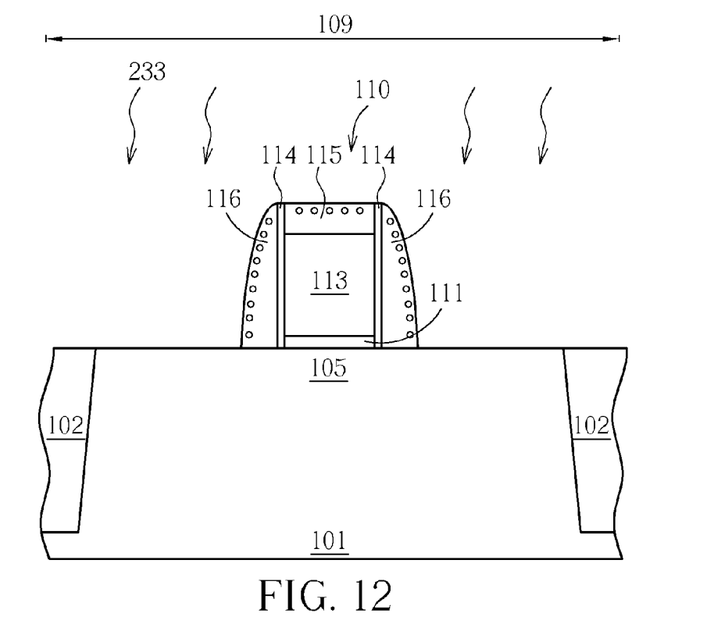

Second, as shown in FIG. 12, a protective step 233 is carried out to modify the first material layer 116 or to further modify the hard mask 115 as well, for example to oxidize the surface of the first material layer 116, in the presence of oxygen as well as in the absence of a photoresist. An oxygen-rich environment may be a dry oxidation such as gaseous oxygen, plasma oxygen and/or a wet oxidation such as a wet chemical treatment to provide a chemical oxidizing environment. In one preferred example of the present invention, a conventional $O_2$ strip process may serve as the protective step at this moment even when the photoresist is absent from the substrate 101 to modify the surface of the first material layer 116. Optionally, the protective step may also use de-ionized water to clean the substrate 101, the shallow trench isolation 102, the gate structure 110 and the modified first material layer 116.

Figure 13:
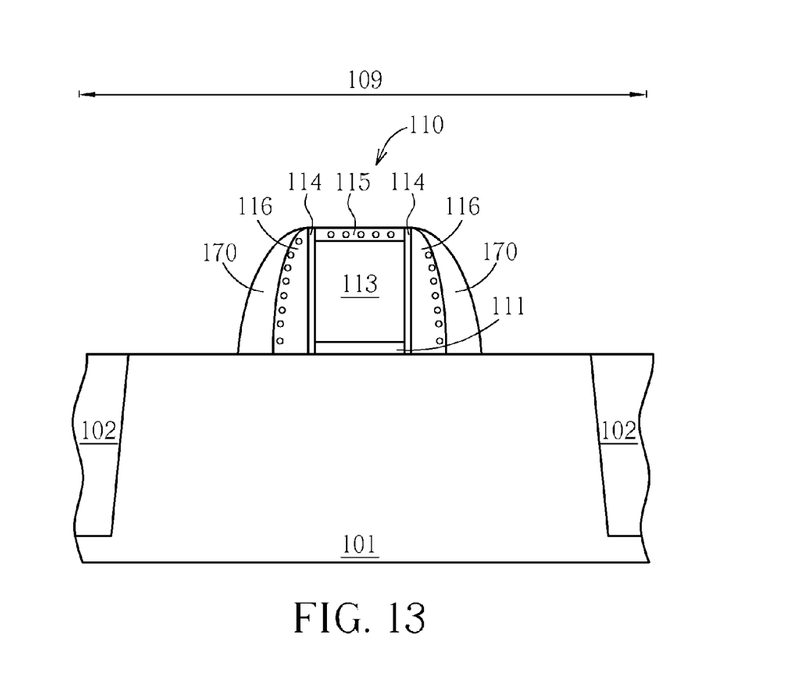

Then, a formation step, such as a dry etching step and a material layer deposition step, is carried out after the protective step 223. In this formation step, a second material layer 170 consisting of silicon nitride is formed. Specifically speaking, the silicon nitride layer may be formed by a Si-containing precursor, such as by hexachlorosilane (HCD) or a precursor of hexachlorosilane deposited by an atomic layer deposition process (ALD-HCD) but the present invention is not limited to these. As shown in FIG. 13, the second material layer 170 may form another spacer which surrounds the gate structure 110. For example, after the protective step 223 a sacrificial spacer 170 is formed to surround the first material layer 116 accordingly.

Figure 14:
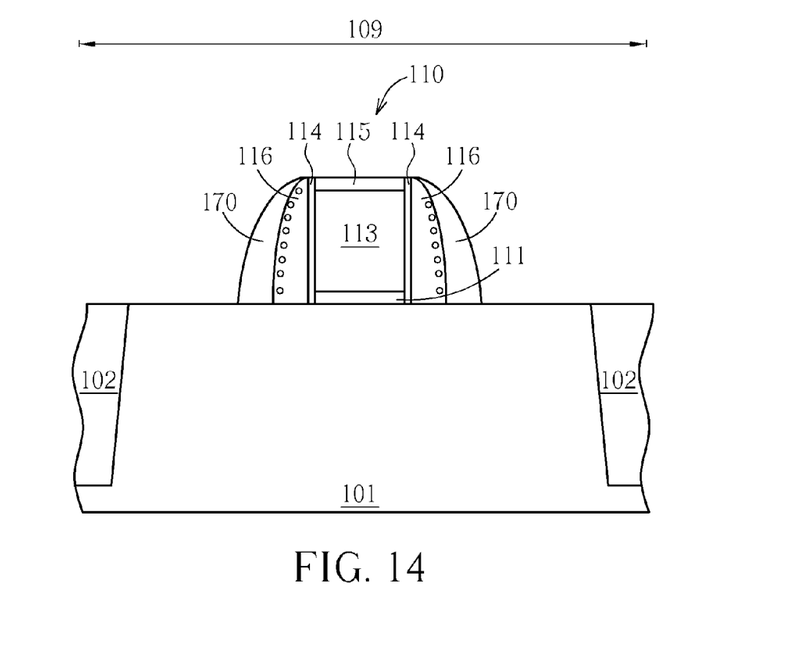

In addition, in the presence of the sacrificial spacer 170 an exclusive de-modification step is carried out on the hard mask 115 so that the following removal step may remove the hard mask 115 as well as the sacrificial spacer 170 at the same time without substantially damaging the first material layer 116. For example, after the formation step a wet clean step based on dilute hydrofluoric acid may be carried out on the exposed hard mask 115 to serve as the de-modification step to eliminate the modification status (indicative hollow dots) of the hard mask 115, as shown in FIG. 14.

Figure 15:
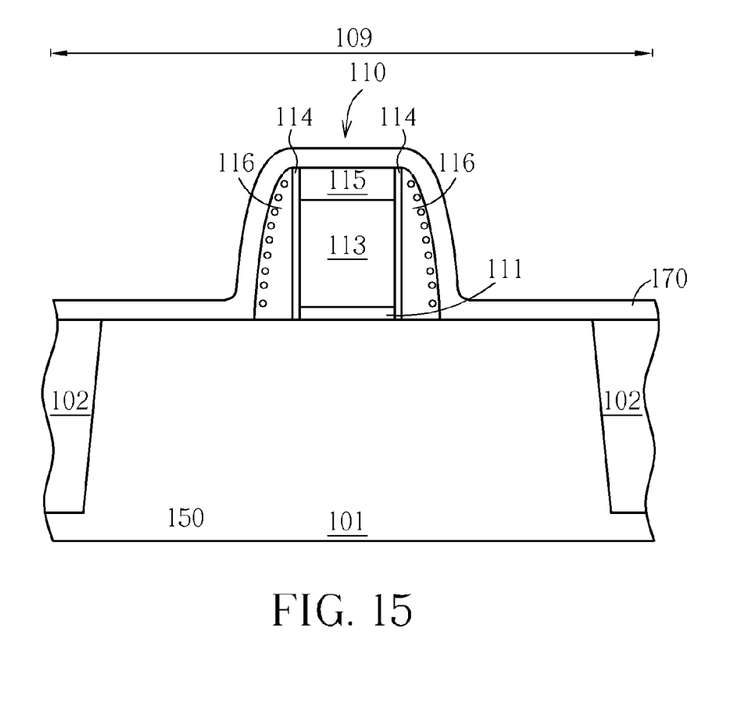

Or alternatively, the second material layer 170 may completely cover the substrate 101, the shallow trench isolation 102, the gate structure 110, the modified first material layer 116 and other optional elements, as shown in FIG. 15. In addition, the second material layer 170 may also be disposed on the substrate 101 in a way other than these as described earlier.

Next, after the formation step follow the optional steps for other elements. These optional steps may be relevant or irrelevant to the second material layer 170. For example, if these optional steps are relevant to the second material layer 170, they may be steps for the selective epitaxial growth (SEG) process as described in the FIRST EXAMPLE or for the stress-providing layer in a stress memorization technique (SMT), as shown in FIG. 15. During the stress memorization technique (SMT) an annealing step may be carried out to alter the stress in the substrate 101 by means of the sacrificial spacer 170. If these optional steps are irrelevant to the second material layer 170, they may be steps for the source/drain implantation (not shown).

Figure 16:
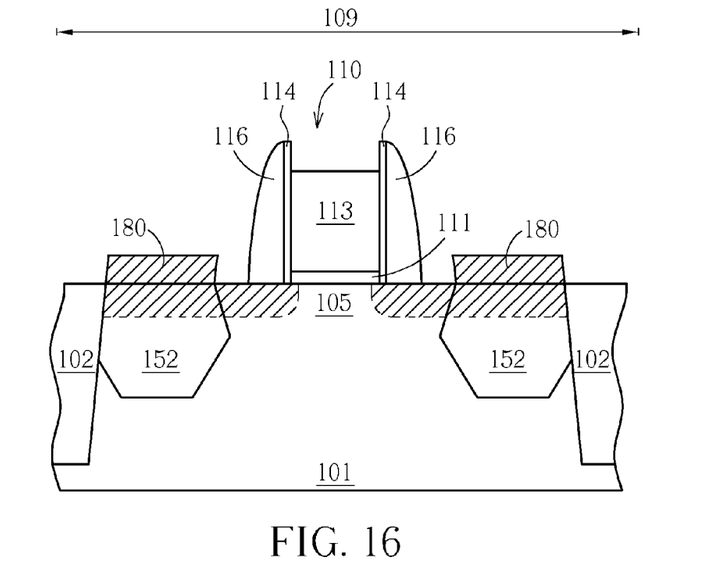

After the optional steps for other elements, the removal step is carried out, as shown in FIG. 16. The removal step removes the second material layer 170 and some of or all of the hard mask 115 with a non-oxidative acid, such as hot phosphoric acid. Hot phosphoric acid strips the second material layer 170 formed of nitride. Since the first material layer 116 whose surface consists of nitride has already been modified in the previous protective step, the thickness of the first material layer 116 would be rarely slashed in the removal step. In such a way, the electronic properties of the gate structure 110 can remain intact. For example, if the thickness of the modified first material layer 116 is around 50 Å before the removal of the second material layer 170, the thickness of the modified first material layer 116 is not less than 45 Å after the removal of the second material layer 170. In other words, the dimensional loss of the modified first material layer 116 is not greater than 5 Å after the removal step.

Figure 17:
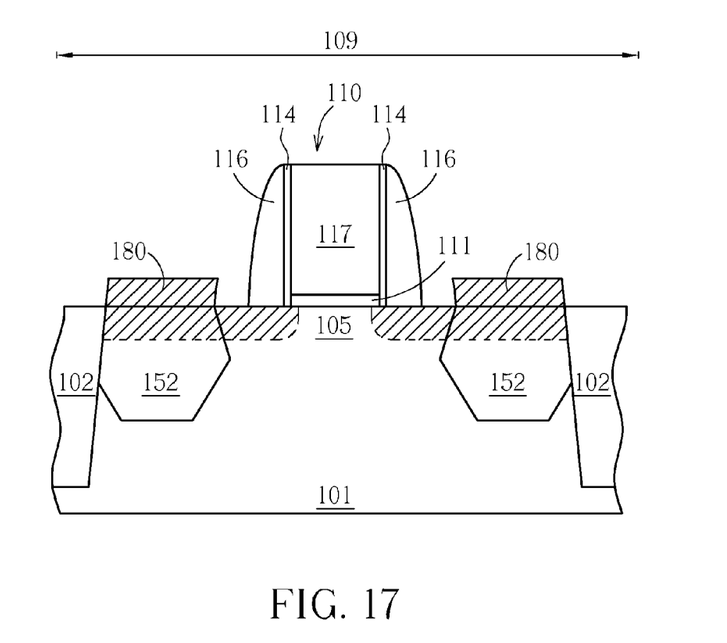

After the second material layer 170 is removed, some other optional semiconductor steps may be carried out. For example, steps for the source/drain implantation to form the source/drain doping regions 180, and the resultant source/drain regions (not shown) is not closely adjacent to the modified first material layer 116, or to replace the gate material layer 113 with an apt metal material to obtain a metal gate, the formation of silicide . . . etc. If the current gate material layer 113 is a dummy gate made of a sacrificial material, the step to remove the sacrificial spacer 170 may also strip the hard mask 115 as well at the same time, and the gate material layer 113 is replaced with a metal material to form a metal gate in the following procedures, as shown in FIG. 17.

To be short, the present invention provides a novel method to remove one nitride material layer without substantially damaging another previously formed nitride material layer with or without a photoresist present on a substrate. For example, a photoresist is removed in the absence of oxygen and follows a protective step in the presence of oxygen so that the modified nitride material layer may avoid the shortcoming that a later removal step may likely slash it.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate with a gate structure disposed thereon and a spacer surrounding said gate structure, wherein a surface of said spacer consists of silicon nitride;
   forming a photoresist covering said substrate;
   performing an implantation step to form a lightly doped drain in said substrate on at least one side of said gate structure in the protection of said photoresist;
   performing a stripping step to remove said photoresist in the absence of oxygen;
   performing a protective step to modify said spacer by oxidizing said surface of said spacer for forming an oxide on said surface of said spacer in the presence of oxygen to obtain a modified spacer after said stripping step;
   forming a material layer consisting of silicon nitride disposed on said modified spacer after said protective step; and
   performing a removal step after said protective step to remove said material layer without substantially damaging said modified spacer.

2. The method for forming a semiconductor device of claim 1, wherein said surface of said spacer comprises silicon nitride after said protective step.

3. The method for forming a semiconductor device of claim 1, wherein an oxygen-free gas is used in the absence of oxygen, and said stripping step further uses an alkaline substance to clean said substrate, said gate structure and said spacer.

4. The method for forming a semiconductor device of claim 1, further comprising:
blanketly forming said material layer on said substrate to cover said gate structure and said modified spacer;
performing an etching step to partially remove said material layer so that said material layer forms a disposable spacer disposed outside said spacer and a recess is respectively formed in said substrate at both sides outside of said disposable spacer;
performing a selective epitaxial growth (SEG) process to respectively form an epitaxial layer in said recess; and
performing said removal step.

5. The method for forming a semiconductor device of claim 1, further comprising:
performing a pre-amorphorizing implantation step on said substrate;
blanketly forming said material layer serving as a strained layer to provide a stress on said substrate to cover said gate structure and said modified spacer;
performing a stress-memorizing step so that said substrate memorizes said stress; and
performing said removal step.

6. The method for forming a semiconductor device of claim 1, wherein said modified spacer has a dimensional loss less than 5 Å after said removal step.

7. The method for forming a semiconductor device of claim 1, wherein said protective step comprises at least one of a dry oxidization and a wet oxidization.

8. The method for forming a semiconductor device of claim 1, wherein said protective step further comprises cleaning said substrate, said gate structure and said spacer with de-ionized water.

9. A method for forming a semiconductor device, comprising:
providing a substrate without a photoresist and with a defined gate structure disposed thereon and with a first material layer disposed on said gate structure, wherein said first material layer comprises a nitride;
performing a protective step to modify said first material layer in the presence of oxygen;
forming a second material layer disposed on said first material layer and on said substrate after said protective step; and
performing a removal step after said protective step to remove said second material layer on said first material layer with a non-oxidative acid without substantially slashing said modified first material layer, wherein said second material layer comprises a nitride.

10. The method for forming a semiconductor device of claim 9, wherein said first material layer is oxidized in said protective step so that a surface of said first material layer consists of silicon nitride and an oxide.

11. The method for forming a semiconductor device of claim 10, further comprising:
after forming said second material layer but before said removal step performing an etching step to partially remove said second material layer so that said second material layer becomes a disposable spacer disposed on said first material layer and to form a recess respectively disposed in the substrate at a side of said disposable spacer, wherein said second material layer covers said first material layer; and
performing a selective epitaxial growth (SEG) process to respectively form an epitaxial layer in said recess.

12. The method for forming a semiconductor device of claim 9, wherein said protective step further comprises cleaning said substrate, said gate structure and said first material with de-ionized water.

13. The method for forming a semiconductor device of claim 9, wherein said protective step uses gaseous oxygen.

14. The method for forming a semiconductor device of claim 9, wherein said protective step uses plasma oxygen.

15. The method for forming a semiconductor device of claim 9, wherein said protective step uses a wet chemical treatment.

16. The method for forming a semiconductor device of claim 9, further comprising:
performing said protective step to simultaneously modify said first material layer and a hard mask, wherein said hard mask comprises nitride for defining said gate structure;
forming the second material layer serving as a sacrificial spacer surrounding said first material layer after said protective step;
exclusively performing a de-modification step on said hard mask while said sacrificial spacer surrounds said first material layer; and
performing said removal step to remove said second material layer and at least part of said hard mask at the same time after said de-modification step.

17. The method for forming a semiconductor device of claim 9, before removing said second material layer further comprising:
performing an annealing step to alter a stress in said substrate by means of said second material layer.

18. The method for forming a semiconductor device of claim 9, wherein said second material layer is formed between said protective step and said removal step.

19. The method for forming a semiconductor device of claim 9, wherein said first material layer has a dimensional loss less than 5 Å after said removal step.

* * * * *